United States Patent
Kojima

(10) Patent No.: US 6,444,974 B1
(45) Date of Patent: Sep. 3, 2002

(54) METHOD FOR TRANSFERRING A DUMMY WAFER

(75) Inventor: Hiroshi Kojima, Takasago (JP)

(73) Assignees: Asahi Glass Company Ltd., Tokyo (JP); Tokai Carbon Company Ltd., Tokyo (JP)

( * ) Notice: Subject to any disclaimer, the term of this patent is extended or adjusted under 35 U.S.C. 154(b) by 0 days.

(21) Appl. No.: 09/352,782

(22) Filed: Jul. 14, 1999

(30) Foreign Application Priority Data

Jul. 17, 1998 (JP) .......................................... 10-218700

(51) Int. Cl.⁷ ............................................... H01J 40/14
(52) U.S. Cl. .............................. 250/222.1; 250/559.29; 414/935; 432/5
(58) Field of Search ................................ 432/241, 253, 432/258, 5; 118/52, 58; 427/271, 384, 532, 299; 134/6; 250/221, 222.1, 559.12, 559.29, 559.13, 559.33, 559.4; 414/935, 936, 937, 938, 939, 940, 941, 172

(56) References Cited

U.S. PATENT DOCUMENTS

| 4,770,590 A | * | 9/1988 | Hughes et al. ............... 414/172 |
| 5,277,579 A | * | 1/1994 | Takanabe ....................... 432/5 |
| 5,516,283 A | * | 5/1996 | Schrems ..................... 432/241 |
| 5,829,969 A | * | 11/1998 | Miyashita et al. .......... 432/253 |
| 5,937,316 A | * | 8/1999 | Inaba et al. ................. 438/488 |
| 6,300,226 B1 | * | 10/2001 | Miyata et al. .............. 438/488 |

FOREIGN PATENT DOCUMENTS

JP          11-121593        * 4/1999

* cited by examiner

*Primary Examiner*—Stephone Allen
(74) *Attorney, Agent, or Firm*—Oblon, Spivak, McClelland, Maier & Neustadt, P.C.

(57) ABSTRACT

Dummy wafers of SiC having low light transmission properties to light from the light source of a photo-sensor are used, and when wafers undergoes a heat treatment, the dummy wafers are transferred from a wafer cassette to a wafer boat in which the number of dummy wafers and a state of arrangement of the wafers are detected or monitored.

16 Claims, 3 Drawing Sheets

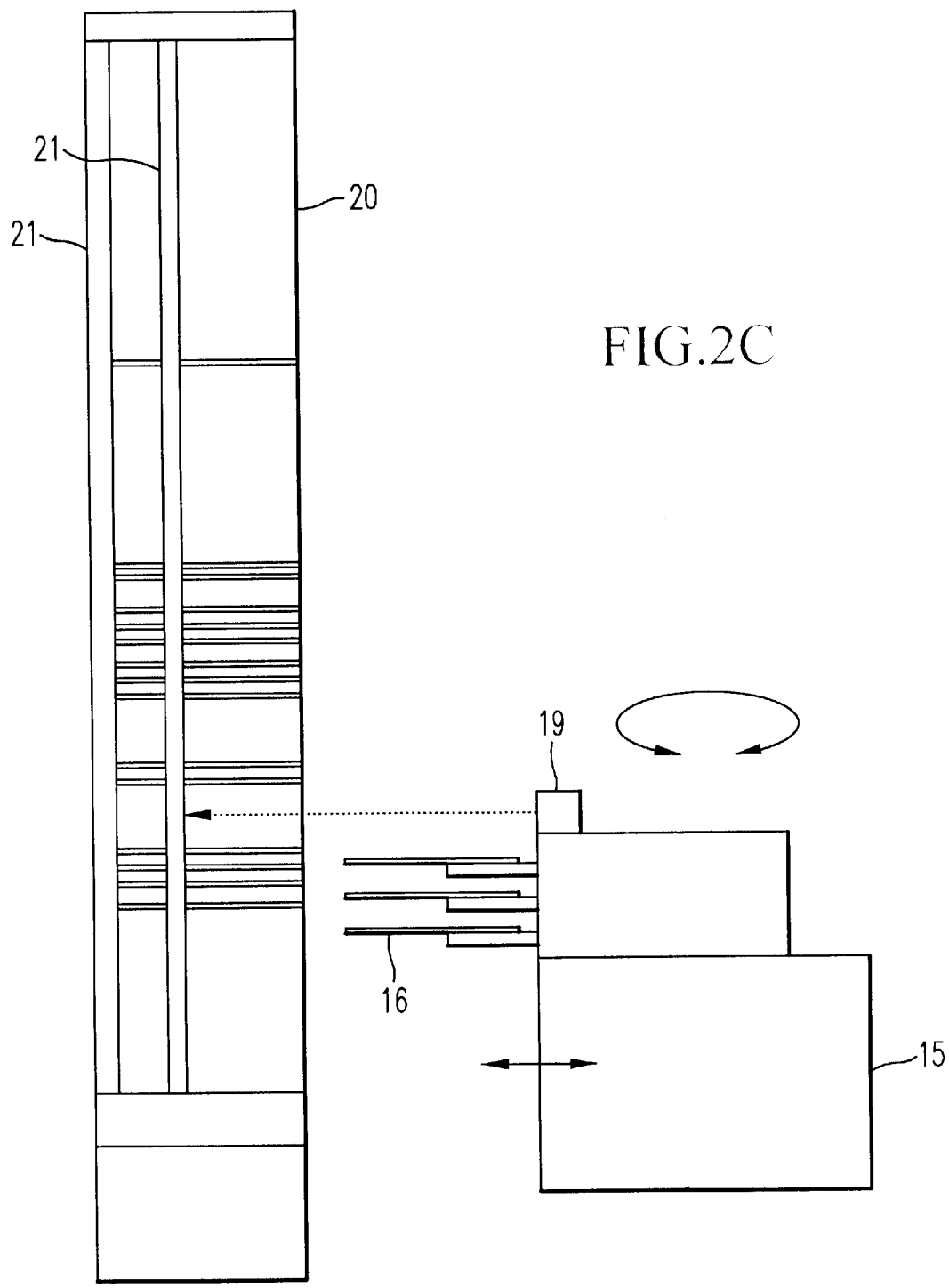

METHOD FOR TRANSFERRING A DUMMY WAFER

BACKGROUND OF THE INVENTION

1. Field of the Invention

The present invention relates to a method for transferring a dummy wafer made of SiC from a wafer cassette for holding it to a wafer boat when semiconductor wafers are heated in a wafer heating apparatus.

2. Discussion of Background

In manufacturing semiconductors, there are steps of forming a thin $SiO_2$ film by the oxidation of a surface of a semiconductor wafer such as a silicon wafer polished to have a mirror surface, diffusing impurities such as phosphorus, nitrogen or the like and forming a thin $Si_3N_4$ or polysilicon film. For these steps, various kinds wafer treating apparatuses such as an oxidation apparatus, a diffusion apparatus, a LPCVD (low pressure chemical vapor deposition) apparatus or the like (hereinbelow, referred simply to heat treatment apparatuses) have been used.

As a heat treatment apparatus, there is, for example, a vertical type heat treatment apparatus 5 as diagrammatically shown in FIG. 1. A number of wafers to be treated are loaded on a wafer boat 20 capable of accommodating, for example, about 50–200 wafers. The wafer boat 20 is generally introduced into the apparatus from its lower portion as shown in the FIG. 1, and a heat treatment is conducted. The wafer boat is generally of a vertical type which comprises upper and lower disk-like fixing plates and three or four supporting columns each having a number of wafer supporting slots in which wafers are inserted to be supported, the supporting slots being formed with intervals of about several mm.

In such heat treatment apparatus, a flow of gas or temperature is apt to become uniform at both ends of the wafer boat. Accordingly, several wafers having the same shape as the semiconductor wafers are arranged as dummy wafers so that a uniform heat treatment is conducted to a number of wafers housed in the wafer boat.

Silicon wafers have generally been used as dummy wafers. In recent years, dummy wafers made of silicon carbide (hereinbelow, referred to as SiC dummy wafers) which lessens the consuming and the occurrence of particles due to the peeling of a film deposited on its surface, even in a highly elevated oxygen atmosphere have been gradually used. Since such dummy wafers are durable in a long term use, they are expected to contribute improvement of productivity. On the other hand, in industries, the transfer of wafers from a wafer cassette to a wafer boat is conducted with a transfer device (a transfer robot). The transferring operations include a step of taking correctly about 1–5 wafers by means of a wafer holding means of a loading device; moving the wafers to the wafer boat while they are held by the wafer holding means; inserting the wafers into the wafer boat through a narrow space between the supporting columns, and placing correctly the wafers in wafer supporting slots formed in the supporting columns. These steps should be carried out automatically and continuously without causing fracture or contamination of the wafers. In view of importance of and difficulty in these operations, various proposals have been made on the structure of the transfer device.

The operations of the transfer robot follow according to a programmed sequence previously inputted in a control device, for instance. In this case, however, it is preferable that the position of the wafer cassette and/or the position or the operation of the wafer boat are detected at predetermined positions by means of sensors such as photo-sensors located predetermined positions to detect an error to set values, and the operations are corrected by a feed-back control so that correct operations are performed according to the programmed sequence by means of, for example, servo mechanisms. In particular, administration of the transferred wafers is important. Therefore, the transferring operations are preferably conducted by detecting and/or monitoring, using sensors such as photo-sensors, the number of wafers which are taken from the cassette and held by the holding means of the transfer robot, the position of each of the wafers held by the holding means, the number of wafers placed regularly in the supporting slots in the wafer boat, and a state of arrangement and so on.

Visible light or an infrared ray is generally used as the light source for the photo-sensors. Since the conventional SiC wafers have high transmission properties to the visible light or the infrared ray, there is a big problem that the SiC dummy wafers do not respond to the sensors. Accordingly, when a dummy wafer is placed slightly shifted from a predetermined position in any step, such a slight shift can not be recognized as error whereby there is substantial reduction in reliability of the transferring mechanism installing sensors therein. Further, there is a possibility that a sensor erroneously responds to a dummy wafer (for example, when a dummy wafer is placed correctly, the sensor recognizes as being not placed), and the control device may operate to stop the operation of the transfer device. In this case, an operator had to do an appropriate treatment.

Further, from the reason of quality control, dummy wafers are loaded in a cassette inclusively used for the dummy wafers and wafers other than the dummy wafers are loaded in a cassette inclusively used for such wafers before they are supplied to the transferring steps. Then, the dummy wafers and the other wafers are taken from respective cassettes to be transferred to the same wafer boat, and are placed at predetermined positions in the wafer boat. After the heat treatment, the dummy wafers and the other wafers are separately taken from the wafer boat, and they are transferred to separate cassettes which are determined for inclusive use. Thus, although the dummy wafers and the other wafers are loaded on the same wafer boat, the transferring operations are conducted for the dummy wafers and the other wafers separately.

SUMMARY OF THE INVENTION

It is an object of the present invention to provide a method for transferring a dummy wafer of SiC wherein when a heat treatment is conducted to dummy wafers of SiC loaded in a wafer boat which is housed in a wafer heating apparatus, the transfer of the dummy wafer from a wafer cassette to the wafer boat is conducted by detecting or monitoring the number of dummy wafers and a state of arrangement of dummy wafers.

In accordance with the present invention, there is provided a method for transferring a dummy wafer of SiC from a wafer cassette for holding it to a wafer boat to be housed in a wafer heating apparatus by means of a wafer transferring device, the method being characterized in that the transferring device has means for conducting a step of taking a dummy wafer from the wafer cassette, a step of transferring the taken wafer to the wafer boat and a step of placing the transferred wafer in a wafer supporting slot in the wafer boat; the dummy wafer is of low transmission properties to light from the light source of a photo-sensor, and the transferring operation is carried out by detecting or monitoring wafers and a state of arrangement of the wafers using the photo-sensor at at least one of these steps.

Further, in accordance with the present invention, there is provided a method for transferring a dummy wafer of SiC from a wafer boat after a heat treatment to a wafer cassette for holding it by means of a wafer transferring device, the method being characterized in that the transferring device has means for conducting a step of taking a dummy wafer from the wafer boat, a step of transferring the taken wafer to the wafer cassette and a step of placing the transferred wafer in a wafer cassette; the dummy wafer is of low transmission properties to light from the light source of a photo-sensor, and the transferring operation is carried out by detecting or monitoring wafers and a state of arrangement of the wafers using the photo-sensor at at least one of these steps.

Each of dummy wafers of SiC (SiC dummy wafers) used in the present invention is a SiC dummy wafer having low light transmission properties. In the specification, the low light transmission properties mean that the transmittance of light having a wavelength used for the light source for a photo-sensor is low enough for detecting. In the case that the light source having a certain range of wavelength, the transmittance is measured at the wavelength wherein the photo-sensor is most sensible within the range. The transmittance of SiC dummy wafer is measured in perpendicular direction of the wafer. The transmittance is preferably 0.8% or less.

The wavelength of the light source for the photo-sensor is preferably 400–10000 nm, more preferably 400–5000 nm, more preferably 400–1500 nm.

With respect to how to produce the SiC dummy wafer having low transmission properties, there is in particular no imitation. However, it is preferable to use such a method that a SiC film of high purity is formed by coating according to a CVD method on a surface of a substrate such as a carbon substrate or a SiC substrate to thereby form, for example, a film comprising a plurality of SiC films. Namely, in the operations for forming the SiC film by CVD, film-forming conditions such as the flow rate of gas as raw material such as silane type, hydrocarbon type, silicon carbide type, halogenated silicon carbide type or the like, the flow rate of dilute gas such as hydrogen, helium, nitrogen or the like, the concentration of the raw material gas, reaction temperature, reaction pressure and so on are changed, for example, stepwise to thereby change the properties of crystal and/or the crystalline orientation, whereby the SiC film composed of at least two kinds of different crystal structures is formed.

When the SiC film formed by CVD has such different crystal structures or orientations, incident light is reflected, scattered and deflected in the dummy wafer whereby the light transmittance can be reduced. The different crystal structures or orientations may be in a form of layer or island. However, it is preferable for the crystalline structures or orientations to have a layered form from the viewpoint of easy production since the CVD coating method is basically a technique for forming a thin film. The combination of different crystal structures or orientations may be a combination of same α-SiC having different orientations, a combination of same β-SiC having different orientations or a combination of α-SiC and β-SiC.

There are many variations as to operating conditions of CVD to form such film of low transmission properties. For example, the flow rate of the raw material gas is periodically increased or decreased; the raw material gas is supplied intermittently or in a form of pulsation; reaction temperature and pressure are changed periodically or stepwise, or the kind or the flow rate of the dilute gas is changed periodically or stepwise. These operating conditions may be changed by combining at least two of the above-mentioned.

It is preferable that any dummy wafer on which the SiC film is formed by CVD, used in the present invention has substantially the same dimensions as any regular wafer such as a silicon wafer supported together with the dummy wafer in the same wafer boat. Namely, the dimensions of the dummy wafer are chosen in conformity with those of the regular wafer used. Usually, the thickness is 0.3–3.0 mm and the diameter (maximum) is 100–400 mm. Further, the dummy wafer may have a circular form or a form wherein a mark indicating an orientation is formed by cutting a part of the circular shape, an orientation flat form or a form having a notch.

In the present invention, a SiC dummy wafer or wafers of low transmission properties and a plurality of wafers which are respectively housed in separate wafer cassettes are respectively taken, and the SiC dummy wafer(s) and the regular wafers are transferred into a single wafer boat by means of a wafer transferring device.

The wafer transferring device is provided with means for conducting a step of taking a dummy wafer(s) from the wafer cassette, a step of transferring the taken wafer to the wafer boat and a step of placing the transferred wafer in a wafer supporting slot or slots in the wafer boat.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2(A)–2(C) are diagrams showing steps of transferring the wafers from a wafer cassette to the wafer boat.

DETAILED DESCRIPTION OF THE PREFERRED EMBODIMENTS

A preferred Embodiment of transferring steps of the present invention will be described with reference to FIGS. 2(A)–2(C).

Figure 2A:
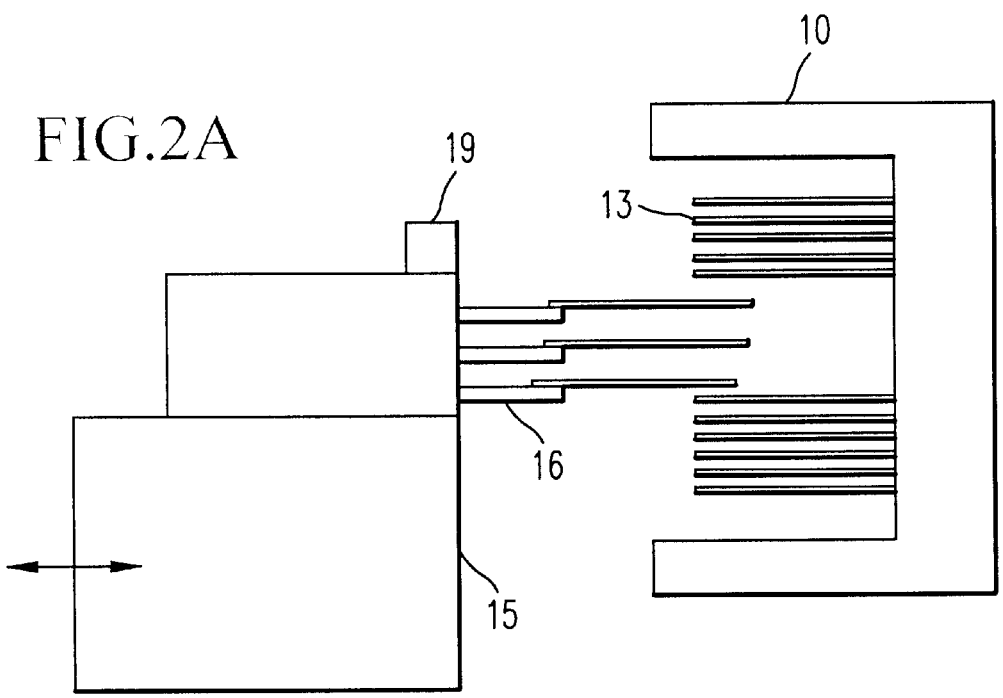
Figure 2B:
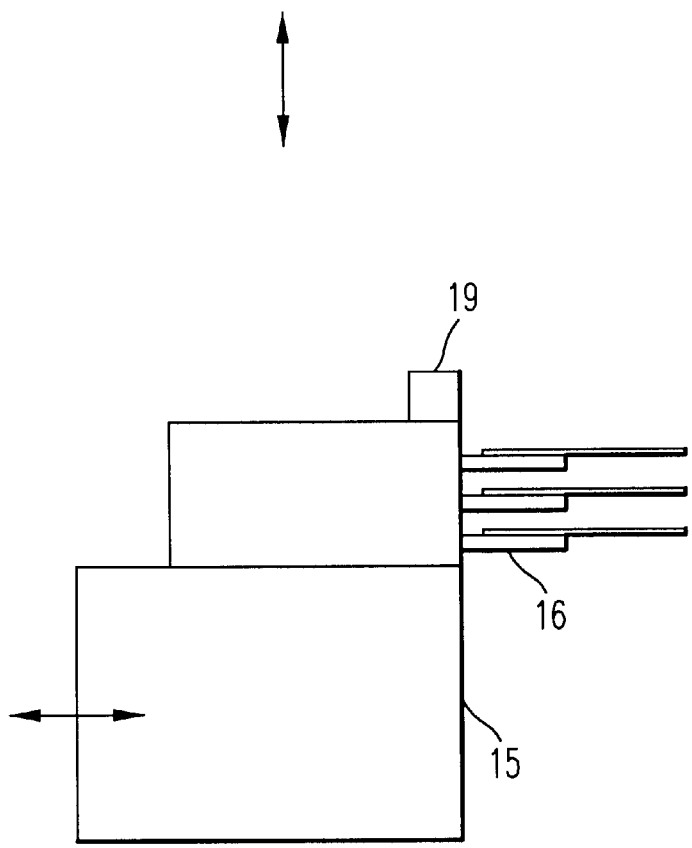

In FIGS. 2(A)–2(C), reference numeral 10 designates a wafer cassette holding dummy wafers or regular wafers 13 and numeral 15 designates a wafer transferring device. As described above, dummy wafers and regular wafers are held in separate wafer cassettes.

The wafer transferring device 15 is a transferring robot which conducts transferring operations automatically. The transferring robot has at least a taking means which holds a wafer and draws it out from the wafer cassette. A wafer holding means 16 may be an optional one, e.g., it may clamp the wafer by a pressure of holding fingers; it may have a pad for sucking the wafer by utilizing vacuum, or it may have a jig called tweezers which can hold the wafer by vacuum.

The holding means 16 of the wafer transferring device 15 takes a 1–5 number of wafers from the wafer cassette. In this case, it is necessary to confirm by means of a photo-sensor that a predetermined number of wafers are correctly taken, and the taken wafers are held in a regular state by the holding means 16. FIG. 2(A) shows that three wafers 13-1, 13-2 and 13-3 are intended to draw out from the wafer cassette, however, there is an erroneous operation to a wafer, for example, 13-1, and the wafer 13-1 is absent on the holding means 16. In this Embodiment, three wafer number counting sensors 17, 17', 17" are provided corresponding to the three taken wafers 13-1, 13-2 and 13-3. In this case, as soon as one of the sensors detects the lack of the wafer 13-1, it stops the operations of, for example, the transferring device.

After an appropriate treatment has been conducted by an operator, the transferring device is re-started. It is not always necessary to provide a plurality of sensors as shown in FIG. 2(A), but a single sensor may be provided so that it scans vertically to detect any error to a plurality of wafers.

FIG. 2(B) shows a state that predetermined three wafers 13-1, 13-2 and 13-3 have been drawn wherein the first wafer 13-1 is slightly shifted from an edge portion of another wafer which is located at the regular position because there is an error in holding operations of the holding means such as tweezers. An abnormal holding condition such as "projection" or "shift" or the like of a wafer is detected by a wafer position detecting sensor 18. The projected wafer as indicated by the numeral 13-1 interrupts at its end portion light from the sensor whereby the sensor detects abnormality. Then, the sensor stops the transferring device. After an appropriate treatment has been made, the device is re-started. In this sense, the photo-sensor may have the function of a photoelectric switch.

The photo-sensor comprises a light emitting element such as LED and a light receiving element such as a phototransistor or photodiode. Various types of photo-sensors can be used for respective purposes. A type wherein a light source (a light projecting portion) and a light receiving portion are separated may be used, or a type wherein a light source and a light receiving portion constructed in a modular form may be used. The later case wherein a light emitting element and a light receiving element are in the same package is called a photocoupler. A photo-interrupter which detects an object (e.g. an edge portion of a wafer) by the interruption of light between the elements, or a photo-reflector for detecting the presence or absence of a wafer by the reflection of light can be suitably used in the present invention. Further, a photo-sensor in which a signal processing IC called a photo-IC is integrated with a photodiode can be suitably used as a photoelectric switch which detects abnormality in a holding state of wafers to stop the device. Further, since the photo-sensor can be used as a distance measuring photo-sensor for measuring the distance to wafers, it may be installed in the wafer transferring device so that when the transferring device brings the holding means closer to the wafer cassette to take wafers, the photo-sensor controls the operation of the transferring device and holding means.

Thus, abnormality in the number of wafers or the state of holding wafers in the step of taking wafers is examined by the photo-sensor. In the present invention, the above-mentioned wafers may be SiC dummy wafers. Since the SiC dummy wafers are of low transmission properties to light from the light source of the photo-sensor, and accordingly, they can be detected by the photo-sensor in the same manner as the other wafers.

In a case of using conventional SiC dummy wafer having light transmission properties, when the wafer 13-1 in FIG. 2(A) is of SiC, the photo-sensor can not detect the SiC wafer even when the SiC wafer is in fact at this position or the wafer is not at this position because of an erroneous operation.

Further, in a case that the projected wafer 13-1 in FIG. 2(B) is a conventional SiC dummy wafer, the photo-sensor can not recognize it as being projected, and accordingly, the wafer is transferred in a state of being projected.

The transferring device 15 is moved while wafers are held, from the wafer cassette 10 to the wafer boat 20 as shown in I→II→III in FIG. 2 whereby the transferring operations of the wafers are conducted.

The transferring device is preferably a self-travelling robot capable of moving horizontally and/or vertically. Further, it is possible to rotate the device in a state of holding the wafers. FIG. 2 III shows a state of the rotation of the device.

When the transferring device comes closer to the wafer boat according to a predetermined program, or the transferring device approaches the wafer boat by a predetermined distance capable of inserting the wafers wherein the approach of the transferring device being conducted by measuring the distance to the boat by means of a distance measuring sensor 19 installed in the transferring device, the transferring device is stopped and the wafers are inserted into the wafer boat.

The wafer boat 20 comprises 3–4 supporting columns, and the width of openings between adjacent supporting columns is formed so as not to differ from the diameter of the wafers. Accordingly, the wafer holding means of the transferring device detects the positions of supporting columns 21 by means of the distance measuring (or position measuring) sensor 19 installed in the transferring device and inserts the wafers carefully in the boat so as not to contact with the supporting columns. The inserted wafers are placed in wafer supporting slots formed in the supporting columns.

Confirmation should be conducted as to whether a predetermined number of wafers are placed without fail in the boat or not, and whether the wafers are correctly placed in the slots without any projection or not. Such confirmation is preferably conducted as shown in FIG. 2(C) which corresponds to the ways of confirmation in FIGS. 2(A) and 2(B). In FIG. 2(C), reference numeral 23 designates a wafer number counting sensor and numeral 25 designates a wafer position detecting sensor. When any of the sensors detects abnormality, it generates normally an alarm to notify an operator, and the operator conducts the same treatment as described above. As a cause of resulting a short of wafers, there is a case that a wafer may drop because the wafer held by the holding means such as tweezers can not be smoothly placed in the supporting slots of the boat, or a wafer remains on the holding means such as tweezers because of failure of inserting the wafer into the supporting slots. Accordingly, it is preferable to detect a possibly remaining wafer on the holding means by the sensor at the position III in the same manner as the way of detection as shown in FIG. 2(A).

Figure 1:
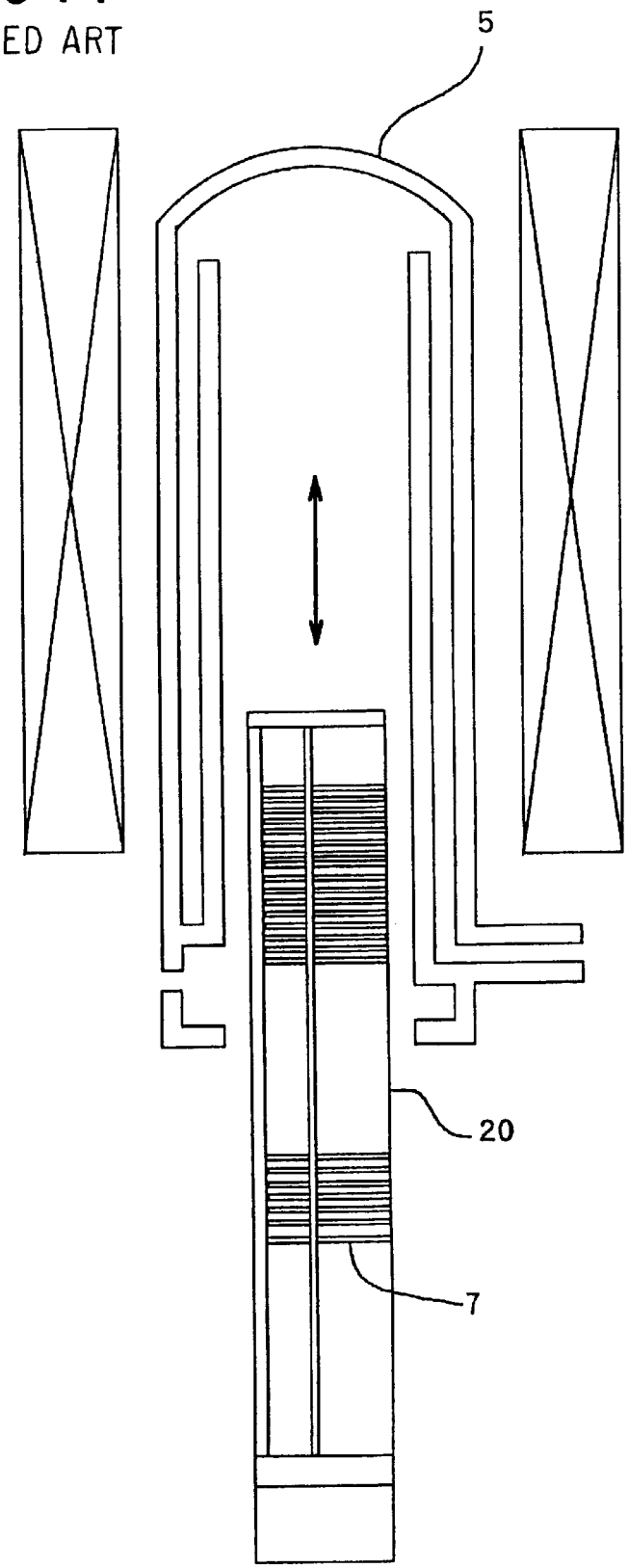
FIG. 1 is a diagram showing a state that a wafer boat holding a plurality of wafers is introduced into a heat treatment apparatus.

As described above, the wafers are transferred into the wafer boat. The wafer boat 20 holding a plurality of wafers including dummy wafers is introduced into a vertical type heat treatment apparatus (FIG. 1) from its lower portion, and a heat treatment is conducted.

After completion of the heat treatment, the wafer boat holding the wafers including the dummy wafers is drawn from the lower portion of the heat treatment apparatus. The dummy wafers and the regular wafers after having been heated are transferred from the wafer boat to separate wafer cassettes by means of the wafer transferring device in the procedure reverse to the above-mentioned. The transferring operations are conducted basically in the same manner as the transferring steps from the wafer cassettes to the wafer boat.

Now the present invention will be described in detail with reference to Examples. However, it should be understood that the present invention is by no means restricted by such specific Examples.

EXAMPLE 1

(Preparation of SiC Wafers Having Low Transmission Properties)

A carbon substrate (of circular shape having a diameter of 200 mm) was used. A SiC-CVD coating method wherein CVD conditions were changed stepwise was conducted to the carbon substrate. The carbon substrate was cut in parallel to a flat surface of the substrate, and carbon was removed from the cut products to obtain SiC dummy wafers. Each of the obtained dummy wafers had a three layered structure wherein an upper layer and a lower layer are composed of β-SiC having crystal boundary oriented in perpendicular to the face of the dummy wafer and an intermediate layer is composed of β-SiC having crystal boundary oriented in parallel to the face of the dummy wafer. The thickness of the upper layer was 200 µm, the thickness of the intermediate layer was 100 µm and the thickness of the lower layer was 200 µm. In the measurement of the light transmittance of the dummy wafers, it was confirmed that the transmittance of 0.5(%) at a wavelength of 800 nm could be obtained.

(Transferring tests for SiC dummy wafers)

Silicon wafers (having an orientation flat shape having a length of 57.5 mm and 0.5 mm (thickness)×200 mm (maximum diameter)) and the SiC dummy wafers produced as described above were respectively put in separate wafer cassettes. Tests on the possibility of taking wafers, moving the wafers and transferring the wafers into the wafer boat were conducted with use of a self-travelling transferring robot which was used actually in industries.

The number of wafers to be taken at each time was 1 or 5.

First, tests were conducted for silicon wafers, and it was confirmed that the transferring operations were performed without any trouble. In the next, similar transferring tests were conducted to take dummy wafers from the cassette for holding them, and it was confirmed that the transferring could be conducted in the same manner as those for the silicon wafers.

A SiC dummy wafer was intentionally projected by a manual operation. It was confirmed that a wafer position detecting sensor could detect the projection, and the device was certainly stopped.

COMPARATIVE EXAMPLE 1

The same tests as in Example 1 were conducted except that β-SiC wafers (an orientation flat shape having a length of 57.5 mm and 0.5 mm (thickness)×200 mm (maximum diameter)) were used as dummy wafers. The transmittance at a wavelength of 800 nm of the wafers is 1.0%.

The dummy wafers were correctly taken by the holding means. However, the wafer number counting sensor could not correctly recognize the fact, and the device was frequently stopped due to erroneous operations.

A SiC dummy wafer was intentionally projected from the regular position by a manual operation. The wafer position detecting sensor could not detect the fact, and the device could not be stopped and continued the transferring operations.

In accordance with the present invention, with use of SiC dummy wafers having low transmission properties to light from the light source of a photo-sensor, the transferring operations of the dummy wafers from a wafer cassette to a wafer boat or the transferring operations of the dummy wafers from the wafer boat to the wafer cassette can certainly be conducted by detecting or monitoring a state of arrangement of the dummy wafers.

Obviously, numerous modifications and variations of the present invention are possible in light of the above teachings. It is therefore to be understood that within the scope of the appended claims, the invention may be practiced otherwise than as specifically described herein.

What is claimed is:

1. A method for transferring a dummy wafer of SiC from a wafer cassette to a wafer boat to be housed in a wafer heating apparatus, the method comprising the steps of:
    (a) removing the dummy wafer from the wafer cassette using a wafer transferring device;
    (b) transferring the dummy wafer to the wafer boat;
    (c) placing the dummy wafer in a wafer supporting slot in the wafer boat; and
    (d) monitoring whether the dummy wafer is correctly positioned within the wafer supporting slot using a photo-sensor and a light source during at least one of steps (a) through (c),
    wherein the dummy wafer has minimal transmittance to light from the light source of the photo-sensor.

2. The method for transferring a dummy wafer according to claim 1, wherein the transmittance of the dummy wafer to light from the light source of the photo-sensor is 0.8% or less.

3. The method for transferring a dummy wafer according to claim 1, further comprising a step if detecting the dummy wafer using a wafer number counting sensor during at least one of steps (a) through (c).

4. The method for transferring a dummy wafer according to claim 1, wherein the wavelength of light from the light source of the photo-sensor is in a range of 400–10000 nm.

5. The method according to claim 1, wherein the dummy wafer contains at least two kinds of crystals having different crystal structures or orientations.

6. The method according to claim 5, wherein the crystal structures are in a layered form.

7. A method for transferring a dummy wafer of SiC from a wafer boat after a heat treatment to a wafer cassette, the method comprising the steps of:
    (a) removing the dummy wafer from the wafer boat using a wafer transferring device;
    (b) transferring the dummy wafer to the wafer cassette;
    (c) placing the dummy wafer in the wafer cassette; and
    (d) monitoring whether the dummy wafer is correctly positioned within the wafer supporting slot using a photo-sensor and a light source during at least one of steps (a) through (c),
    wherein the dummy wafer has minimal transmittance to light from the light source of the photo-sensor.

8. The method for transferring a dummy wafer according to claim 7, wherein the transmittance of the dummy wafer to light from the light source of the photo-sensor is 0.8% or less.

9. The method for transferring a dummy wafer according to claim 7, further comprising a step of detecting the dummy wafer using a wafer number counting sensor during at least one of steps (a) through (c).

10. The method for transferring a dummy wafer according to claim 7, wherein the wavelength of light from the light source of the photo-sensor is in a range of 400–10000 nm.

11. The method according to claim 7, wherein the dummy wafer contains at least two kinds of crystals having different crystal structures or orientations.

12. The method according to claim 11, wherein the crystal structures are in a layered form.

13. A method for transferring a dummy wafer of SiC from a wafer cassette to a wafer boat to be housed in a wafer heating apparatus, and successively transferring the dummy wafer from the wafer boat after a heat treatment to the wafer cassette, the method comprising the steps of:

(a) removing the dummy wafer from the wafer cassette using a wafer transferring device;

(b) transferring the dummy wafer to the wafer boat;

(c) placing the dummy wafer in a wafer supporting slot in the wafer boat;

(d) removing the dummy wafer from the wafer boat;

(e) transferring the dummy wafer to the wafer cassette;

(f) placing the dummy wafer in the wafer cassette;

(g) monitoring whether the dummy wafer is correctly positioned within the wafer supporting slot using a photo-sensor and a light source during at least one of steps (a) through (f), wherein the dummy wafer has minimal transmittance to light from the light source of the photo-sensor.

14. The method according to claim 13, wherein the transmittance of the dummy wafer to light is 0.8% or less.

15. The method according to claim 13, wherein the body contains at least two kinds of crystals having different crystal structures or orientations.

16. The method according to claim 15, wherein the crystal structures are in a layered form.

* * * * *